United States Patent [19]
Cheng et al.

[11] Patent Number: 6,066,028
[45] Date of Patent: May 23, 2000

[54] POLISHING OF COPPER

[75] Inventors: Shu-Fan Cheng, Silver Spring, Md.; Darrell King, Woodbridge, Va.

[73] Assignee: The United States of America as represented by the Secretary of the Navy, Washington, D.C.

[21] Appl. No.: 09/210,710

[22] Filed: Dec. 14, 1998

[51] Int. Cl.⁷ ........................................................ B24B 1/00
[52] U.S. Cl. .................................................. 451/28; 51/307
[58] Field of Search ................................ 510/175; 451/41, 451/285, 287, 288, 36, 28, 63; 252/79.1, 79.2, 79.4; 51/307, 308, 309; 106/3; 438/693, 592

[56] References Cited

U.S. PATENT DOCUMENTS 5,800,577  9/1998  Kido .......................................... 51/307

*Primary Examiner*—Derris Holt Banks
*Attorney, Agent, or Firm*—Barry A. Edelberg; George A. Kap

[57] ABSTRACT

A composition for chemical mechanical polishing of copper that includes 0.5–5% by volume of an etchant such as nitric acid, ammonium hydroxide, hydrogen peroxide, acetic acid, or ammonium chloride; 0.1–1% by weight of an azole selected from benzotriazole and derivations thereof that function similarly to bezotriazole in the composition; 0.1–2% by volume of a biodegradable detergent; and deionized water or a lower alkanol to make 100% by volume of the composition. The polishing method includes the step of polishing the bottom copper surface of a magnetic electronic device with the polishing composition of this invention for 5–30 minutes to obtain rms roughness of the copper surface of less than about 6 Å.

20 Claims, No Drawings

POLISHING OF COPPER

BACKGROUND OF THE INVENTION

1. Field of the Invention

This invention pertains to polishing of copper on semiconductor devices to a roughness of less than about 6 Å without imparting scratches.

2. Description of Related Art

Copper is a candidate for on-chip interconnections for ultralarge-scale integrated circuits. Chemical mechanical polishing is an important technique in creating a planarized surface for copper laid connections. The current polishing techniques usually use alumina abrasive in either ammonia or nitric acid or hydrogen peroxide based slurries. Due to the softness of copper, this generally creates macro and microscratches. These scratches generate problems in quality control and device performance, especially in small featured devices.

Roughness of a copper surface is a critical issue in magnetic devices because soft and hard magnetic layers tend to magnetically couple to each other when they are grown on a rough yet soft copper surface. This coupling is detrimental to the magnetic properties of an electronic magnetic device.

U.S. Pat. No. 5,800,577 to Kido discloses a polishing composition for chemical mechanical polishing of copper comprising a carboxylic acid, an oxidizing agent, and water. The polishing composition is adjusted with an alkali to a pH of 5–9.

The Kido U.S. Pat. No. 5,800,577 discloses in col.2 a polishing composition comprising an etching agent containing an aminoacetic acid and/or an amidosulfonic acid, an oxidizing agent, water and a chemical agent which contains at least benzotriazole or a derivative thereof, which forms a protective layer on a material for circuits.

The Kido U.S. Pat. No. 5,800,577 alleges for its polishing composition high polishing rate and formation of few corrosion marks or dishing resulting in a high precision finished surface which is advantageously used in production of semiconductor devices.

OBJECTS AND BRIEF SUMMARY OF THE INVENTION

It is an object of this invention to polish copper in a copper-containing semiconductor electronic device to a smooth, scratch-free surface.

It is another object of this invention to obtain a scratch-free copper surface in a semiconductor electronic device having root mean square roughness of less than about 6 Å.

It is another object of this invention to produce a smooth and scratch-free copper surface to prevent magnetic layers disposed on the smooth and scratch-free copper surface from magnetically coupling to each other.

These and other objects of this invention can be attained by a polishing composition containing a small amount but under 5 volume percent of an etchant, a small amount but under 1 weight percent benzotriazole or a derivative thereof, a small amount but under 1 volume percent detergent, with remaining balance water to 100% by volume.

DETAILED DESCRIPTION OF THE INVENTION

This invention pertains to a polishing composition and to a method for polishing copper down to root mean square roughness of less than about 6 Å. The copper is typically disposed on silicon wafers which are principal components in electronic devices such as integrated circuits, semiconductor devices, and transistors.

The polishing composition of this invention is devoid of abrasives and comprises at least some but less than about 5% by volume of an etchant, typically 0.5–5% by volume; at least some but less than about 1% by weight of benzotriazole or its derivatives, typically 0.1–1% by weight; and at least some but less than about 2% by volume detergent, typically 0.1–2% by volume; with remainder of water or alcohol to 100% by volume.

More typically, the polishing composition of this invention consists essentially of 1–4% by volume nitric acid, 0.1–0.8% by weight benzotriazole, 0.3–1.5% by volume of a biodegradable detergent and deionized water to 100% by volume.

The polishing composition described herein has consistency of water and its pH is typically in the range of 4–12, more typically 5–10. The function of the etchant is to etch the copper surface and its amount should be balanced with amount of benzotriazole or its derivatives in order to obtain an acceptable etch rate typically on the order of 100 Å in about 10 minutes. Generally, the amount of etchant varies directly with amount of benzotriazole or its derivative; i.e., the use of more of one should be accompanied by increased amount of the other, and vice versa. The function of benzotriazole or its derivative is to reduce the effect of the etchant to etch recessed areas of the wafer surface or the valleys between grain boundaries and to reduce oxidation of the copper disposed on the wafer. The purpose of the detergent is to reduce friction by generating a lubricating layer between copper and the polishing pad. By providing the lubricating layer, the detergent thus functions to minimize scratches and acts as a wetting agent in distributing the polishing solution evenly.

A typical etchant can be nitric acid, ammonium hydroxide, hydrogen peroxide, acetic acid or ammonium chloride. Suitable derivatives of benzotriazole are the azoles which function similarly to benzotriazole in the copper polishing composition. An example of a benzotriazole derivative is benzoxazole. Any detergent is suitable herein that prometes lubricity and is biodegradable, including cationic, anionic and non-ionic detergents.

The polishing composition of this invention is used to polish a copper surface to a roughness of less than about 6 Å. Prior art polishing compositions typically contain alumina abrasives that typically have average grain size of about 0.05 micron which grains can agglomerate and impart scratches to a copper surface of up to 1 micron in depth and of a varying length typically up to 100 microns. Depth of the scratches is more typically about 200–3000 Å or up to about 0.3 micron.

Polishing compositions containing an abrasive are typically used initially to polish rough copper surfaces since the presence of an abrasive therein increases polishing rate. Although a polishing composition containing an abrasive may have a high polishing rate, it also may create undesirable scratches in the copper surface.

A typical magnetic device may have a layer of non-magnetic copper of about 2000 Å in thickness on a non-magnetic silicon substrate or a silicon nitride coated substrate, a 30 Å-thick magnetic hard (soft) layer on the copper layer, a non-magnetic 50 Å-thick copper layer on the above-mentioned hard(soft) layer, a 50 Å-thick layer of a magnetic soft(hard) material above the 50 Å-thick copper layer and a 50 Å-thick layer of copper thereon. This structure, without the 2000 Å-copper layer, can be repeated typically 10–20 times. The bottom 2000 Å-copper layer should be smooth since magnetic layers deposited thereon mimic the copper surface (i.e., form conformal layers) and can couple with each other to create detrimental interference problems. Since the coupling effect is directly proportional to roughness, it was determined that roughness of a copper surface, on which is deposited a magnetic layer(s), should be as low as possible preferably less than about 6 Å rms in order to maintain the coupling effect to a tolerable level.

The rms roughness is typically determined using atomic force microscopy by scaning over an area typically 1micron×1 micron and averaging the deflection readings of the tapping cantilever beam.

A magnetic device containing at least one copper surface with a magnetic layer deposited thereon directly or indirectly, should have a smooth and scratch-free copper surface in order to obtain a sharper switching on a magnetization plot of Magnetic Moment (memu) v. Applied Field (Oe). This was verified by many magnetic devices, including devices disposed on a silicon substrate having the following layer composition.

2000 Å SiN/2500 Å Cu/40 Å Ta/50 Å Cu/(30 Å CoFe/50 Å Cu/30 Å Py/50 Å Cu)$_{\times 10}$ The as-deposited copper surfaces had approximate roughness of 40 Å rms whereas copper surfaces polished with the polishing composition of this invention had approximate roughness of 5 Å rms. Surface roughness was obtained by means of atomic force microscope. With the polishing composition, it is possible to obtain optimum magnetic performance by growing magnetic films on a smoothly polished copper surface.

The polishing method using the polishing composition disclosed herein typically involves chemical etching by nitric acid or another etchant. Any particles dislodged from the copper surface react with chemicals in the polishing composition at an accelerated rate and are moved into the polishing composition. In this process, chemicals in the polishing composition can play an important secondary role of passivating the surface being polished until removal of the passivated layer. The latter mechanism helps reduce surface topography.

The chemical phenomena of the polishing process occur at the copper surface at the pad and at the slurry surface, leading to metal dissolution in the slurry that is removed. The mechanical effects of the process are controlled by physical parameters such as pressure, pad velocity, sample rotation, pad-related parameters, and others, whereas the chemical effects of the process are related to the copper etch rate, pH of the polishing composition, oxidation/reduction potential of the polishing composition, selectivity of dielectric and barrier layers, and others.

The polishing composition of this invention can be prepared by adding to a vessel deionized water, 0.1–1% by weight of benzotriazole or its derivative, 0.5–5% by volume an etchant, and 0.1–2% by volume of a biodegradable detergent. A specific polishing composition was prepared by adding to a vessel 990 cc of deionized water; 1 g or 0.1% by weight of powdered benzotriazole, followed by 10 cc or 1% by volume of concentrated nitric acid; which readily dissolved on moderate swirling; and then 4 cc or 0.4% by volume of liquid detergent "FL-70" available from Fisher Scientific. The "FL-70 detergent has the following composition in volume percent:

| | |
|---|---|
| tetrasodium ethylene diamine tetraacetate | -1.4 |
| triethanolamine | -1.3 |
| oleic acid | -3.0 |
| sodium carbonate | -3.0 |
| water | -88.5 |
| polyethylene glycol 400 | -1.0 |
| Tergitol(R) nonionic surfactant | -1.8" | detergent. The polishing composition was at about room temperature and had a slightly acidic pH.

The copper that is polished using the polishing composition of this invention is typically deposited on a silicon wafer or substrate. Deposition of copper can be made by any means but it is typically done by sputtering and the substrate is typically silicon although any other substrate can be used, particularly a semiconducting material. The thick copper layer that is deposited on a silicon substrate forms a layer of a magnetic electronic device that has other layers deposited on the copper layer, as indicated by the following composition of this device: Si/2000 Å SiN/2500 Å Cu/30 Å CoFe/50 Å Cu/30 Å Py/50 Å Cu. The cobalt-iron alloy was 95 atomic percent cobalt and 5 atomic percent iron whereas the permalloy (Py) was 80 atomic percent nickel and 20 atomic percent iron. The 2500 Å copper layer had as deposited rms roughness of 40 Å which was polished with the polishing composition of this invention to an rms roughness of 5 Å, as measured by atomic force microscope.

The polishing composition used to polish the copper layer was composed of 1% by volume nitric acid, 0.1% by weight of benzotriazole, 0.4% by volume of the biodegradable detergent FL-70 with remainder deionized water to 100% by volume. The polishing composition was milky white in color and transparent, had consistency of water at ambient temperature, and had pH of about 6.

The polishing method was carried out using typical polishing procedures. A polishing pad, in this instance a composite of Suba IV and ICI 1400 supplied by Rodel Inc., was placed on a horizontally disposed circular rotating table rotating at 30 rpm. A silicon wafer, measuring 3 inches in diameter and being 14 mil thick, was secured to a circular wafer carrier that was of a diameter that was a fraction of the rotating table. The wafer holder, while operating, was rotated at 30 rpm with the copper surface disposed against the pad. Pressure on the wafer holder was 1.2 psi and amount of copper removed was about 100 Å in about 10 minutes. Pressure on the substrate can be varied to obtain the desired polishing rate and total polishing time can be varied between a few minutes, such as about 5 minutes to about ½ hour, or until the desired smoothness is obtained. The pressure cannot be increased too high since such a condition can cause chattering or friction between the wafer and the pad and reduction of polishing liquid in contact with the wafer which is detrimental to effective polishing. A typical pressure applied to the substrate is 0.1–10 psi, more typically 0.2–5 psi.

The polishing composition was dripped onto the rotating table at a rate of about 200 ml/min while the wafer holder was rotated clockwise and the table was rotated clockwise and the wafer was turned 90° every minute to obtain uniform polishing.

By reducing rms roughness of the copper layer from 40 Å to 5 Å or less, it is possible to improve the sharpness of magnetic switching behavior by reducing the interlayer coupling caused by roughness.

While presently preferred embodiments have been shown of the novel polishing composition and polishing method, and of the several modifications discussed, persons skilled in this art will readily appreciate that various additional changes and modifications may be made without departing from the spirit of the invention as defined and differentiated by the following claims.

What is claimed is:

1. A composition comprising an effective amount but less than about 5% by volume of an etchant selected from the group consisting of nitric acid, ammonium hydroxide, hydrogen peroxide, acetic acid, ammonium chloride, and mixtures thereof; an effective amount but less than about 1% by weight of an azole selected from the group consisting of benzotriazole, derivatives of benzotriazole, and mixtures thereof; an effective amount but less than about 2% by volume of a detergent; and sufficient liquid to yield 100% by volume of said composition, said liquid is selected from the group consisting of water, alcohol, and mixtures thereof.

2. The composition of claim 1 wherein amount of the etchant is 0.5–5% by volume, amount of said azole is 0.1–1% by weight, and amount of said detergent is 0.1–2% by volume.

3. A composition consisting essentially of 0.5–5% by volume of nitric acid, 0.1–1% by weight of benzotriazole, 0.1–2% by volume of a biodegradable detergent, and deionized water to yield 100% by volume of said composition.

4. The composition of claim 3 wherein amount of nitric acid is 1–4% by volume, amount of benzotriazole is 0.3–0.8% by weight, and amount of said detergent is 0.3–1.5% by volume.

5. The composition of claim 3 wherein said liquid is deionized water and said detergent has the following composition in volume percent:

| | |
|---|---|
| tetrasodium ethylene diamine tetraacetate | -1.4 |
| triethanolamine | -1.3 |
| oleic acid | -3.0 |
| sodium carbonate | -3.0 |
| water | -88.5 |
| polyethylene glycol 400 | -1.0 |
| Tergitol (R) nonionic surfactant | -1.8" |

6. A polishing method comprising the step of polishing a copper surface until the desired smoothness is obtained with a composition comprising an effective amount but less than about 5% by volume of an etchant selected from the group consisting of nitric acid, ammonium hydroxide, hydrogen peroxide, acetic acid, ammonium chloride, and mixtures thereof; an effective amount but less than about 1% by weight of an azole selected from the group consisting of benzotriazole, derivatives of benzotriazole, and mixtures thereof; an effective amount but less than about 2% by volume of a detergent; and sufficient liquid to yield 100% by volume of said composition, said liquid is selected from the group consisting of water, alcohol, and mixtures thereof.

7. The method of claim 6 wherein the composition comprises 0.5–5% by volume nitric acid, 0.1–1% by weight of the azole and 0.1–2% by volume of the detergent.

8. A polishing method comprising the step of polishing a copper surface until the desired smoothness is obtained with a composition consisting essentially of 0.5–5% by volume of nitric acid, 0.1–1% by weight of benzotriazole, 0.1–2% by volume of a biodegradable detergent, and deionized water to yield 100% by volume of said composition.

9. The method of claim 8 wherein amount of nitric acid is 1–4% by volume, amount of benzotriazole is 0.3–0.8% by weight, and amount of said detergent is 0.3–1.5% by volume.

10. The method of claim 8 wherein the detergent has the following composition in volume percent:

| | |
|---|---|
| tetrasodium ethylene diamine tetraacetate | -1.4 |
| triethanolamine | -1.3 |
| oleic acid | -3.0 |
| sodium carbonate | -3.0 |
| water | -88.5 |
| polyethylene glycol 400 | -1.0 |
| Tergitol (R) nonionic surfactant | -1.8" |

11. A polishing method comprising the steps of
(a) securing a substrate with a copper layer thereon in a holder, with the copper layer facing away from the holder;
(b) placing the holder on a polishing pad with the copper layer being in contract with the polishing pad;
(c) depositing aqueous copper polishing composition on the polishing pad, the composition comprising an effective amount but less than about 5% by volume of an etchant selected from the group consisting of nitric acid, ammonium hydroxide, hydrogen peroxide, acetic acid, ammonium chloride, and mixtures thereof, an effective amount but less than about 1% by weight of an azole selected from the group consisting of benzotriazole, derivatives of benzotriazole, and mixtures thereof; an effective amount but less than about 2% by volume of a detergent; and sufficient liquid to yield 100% by volume of said composition, said liquid is selected from the group consisting of water, alcohol, and mixtures thereof;
(d) rotating the holder; and
(e) rotating the polishing pad until desired smoothness of the copper layer is attained.

12. The method of claim 11 wherein amount of the etchant is 0.5–5% by volume, amount of the azole is 0.1–1% by weight, and amount of the detergent is 0.1–2% by volume.

13. The method of claim 11 wherein the composition consists essentially of 0.5–5% by volume of nitric acid, 0.1–1% by weight of benzotriazole, 0.1–2% by volume of a biodegradable detergent, and deionized water to yield 100% by volume of said composition.

14. The method of claim 13 wherein amount of nitric acid is 1–4% by volume, amount of benzotriazole is 0.3–0.8% by weight, and amount of the detergent is 0.3–1.5% by volume.

15. The method of claim 14 wherein the detergent in the composition has the following composition in volume percent:

| | |
|---|---|
| tetrasodium ethylene diamine tetraacetate | -1.4 |
| triethanolamine | -1.3 |
| oleic acid | -3.0 |
| sodium carbonate | -3.0 |
| water | -88.5 |
| polyethylene glycol 400 | -1.0 |
| Tergitol (R) nonionic surfactant | -1.8" |

16. The method of claim 13 including the step of applying to the substrate pressure in amount of 0.2–5 psi.

17. The method of claim 16 wherein the composition is continuously applied to the polishing pad.

18. The method of claim 16 including the step of moving the holder on the polishing pad while the holder and the polishing pad are rotated.

19. The method of claim 18 wherein the polishing pad is horizontally disposed on a support, wherein the holder and the polishing pad are rotated in same direction, and wherein the copper layer in contact with the polishing pad has final rms surface roughness of less than about 6 Å that is achieved in a period of time from about 5 minutes to about 0.5 hour.

20. The method of claim 11 including the step of applying pressure to the substrate in amount of 0.1 to 10 psi.

* * * * *